United States Patent [19]
Wheatley, III et al.

[11] Patent Number: 5,461,639
[45] Date of Patent: Oct. 24, 1995

[54] FAST FORWARD LINK POWER CONTROL IN A CODE DIVISION MULTIPLE ACCESS SYSTEM

[75] Inventors: Charles E. Wheatley, III, Del Mar; Roberto Padovani, San Diego, both of Calif. Ephraim Zehavi, Haifa, Isreal

[73] Assignee: Qualcomm Incorporated, San Diego, Calif.

[21] Appl. No.: 276,576

[22] Filed: Jul. 18, 1994

Related U.S. Application Data

[63] Continuation of Ser. No. 156,125, Nov. 22, 1993, Pat. No. 5,383,219.

[51] Int. Cl.⁶ .................. H04L 27/30; H04L 9/00
[52] U.S. Cl. .................. 375/205; 380/34; 455/33.1; 371/43; 379/59
[58] Field of Search .................. 375/205; 380/34; 371/43; 455/33.1; 379/59

[56] References Cited

U.S. PATENT DOCUMENTS

| | | | |
|---|---|---|---|
| 5,265,119 | 11/1993 | Gilhousen et al. | 375/205 |
| 5,267,262 | 11/1993 | Wheatley, III | 375/205 |
| 5,341,396 | 8/1994 | Higgins et al. | 380/34 |
| 5,383,219 | 1/1995 | Wheatley, III et al. | 375/205 |

*Primary Examiner*—Tod R. Swann
*Attorney, Agent, or Firm*—Russell B. Miller; Kenneth W. Bolvin

[57] ABSTRACT

The power control process of the present invention enables a mobile radiotelephone to continuously update the base station on the power output required. The base station sends a frame to the mobile at a particular rate. If the mobile received and decoded the frame correctly, it sets a power control bit in the next frame to be transmitted to the base station. Based on the error rate of the received power control bits, the base station determines whether to increase or decrease the transmit power.

4 Claims, 3 Drawing Sheets

FAST FORWARD LINK POWER CONTROL IN A CODE DIVISION MULTIPLE ACCESS SYSTEM

This is a continuation of application Ser. No. 08/156,125, filed Nov. 22, 1993, now U.S. Pat. No. 5,383,219.

BACKGROUND OF THE INVENTION

1. Field of the Invention

The present invention relates generally to communication systems and particularly to power control in a code division multiple access communication system.

2. Description of the Related Art

The Federal Communications Commission (FCC) governs the use of the radio frequency (RF) spectrum, deciding which industry gets certain frequencies. Since the RF spectrum is limited, only a small portion of the spectrum can be assigned to each industry. The assigned spectrum, therefore, must be used efficiently in order to allow as many frequency users as possible to have access to the spectrum.

Multiple access modulation techniques are some of the most efficient techniques for utilizing the RF spectrum. Examples of such modulation techniques include time division multiple access (TDMA), frequency division multiple access (FDMA), and code division multiple access (CDMA).

CDMA modulation employs a spread spectrum technique for the transmission of information. A spread spectrum system uses a modulation technique that spreads the transmitted signal over a wide frequency band. This frequency band is typically substantially wider than the minimum bandwidth required to transmit the signal. The spread spectrum technique is accomplished by modulating each baseband data signal to be transmitted with a unique wide band spreading code. Using this technique, a signal having a bandwidth of only a few kilohertz can be spread over a bandwidth of more than a megahertz. Typical examples of spread spectrum techniques can be found in *Spread Spectrum Communications*, Volume i, M. K. Simon, Chap. 5, pp. 262–358.

A form of frequency diversity is obtained by spreading the transmitted signal over a wide frequency range. Since only 200–300 kHz of a signal is typically affected by a frequency selective fade, the remaining spectrum of the transmitted signal is unaffected. A receiver that receives the spread spectrum signal, therefore, will be affected less by the fade condition.

In a CDMA-type radiotelephone system, multiple signals are transmitted simultaneously at the same frequency. A particular receiver then determines which signal is intended for that receiver by the unique spreading code in the signal. The signals at that frequency without the particular spreading code intended for that particular receiver appear to be noise to that receiver and are ignored.

FIG. 1 shows a typical prior art CDMA transmitter for use on the reverse channel of a radiotelephone system, the reverse channel being the link from the mobile to the base station. A digital baseband signal is first generated by a vocoder (voice encoder/decoder). The vocoder (100) digitizes an analog voice or data signal using an encoding process such as the Code Excited Linear Prediction (CELP) process that is well known in the art.

The digital baseband signal is input to a convolutional encoder (101) at a particular rate, such as 9600 bps. The encoder (101) convolutionally encodes the input data bits into data symbols at a fixed encoding rate. For example, the encoder (101) could encode the data bits at a fixed encoding rate of one data bit to three data symbols such that the encoder (101) outputs data symbols at a 28.8 ksym/s rate with a 9600 bps input rate.

The data symbols from the encoder are input to an interleaver (102). The interleaver (102) scrambles the symbols such that the lost symbols won't be contiguous. Therefore, if more than one symbol is lost in the communications channel, the error correcting code is able to recover the information. The data symbols are input into the interleaver (102) in a column by column matrix and output from the matrix row by row. The interleaving takes place at the same 28.8 ksym/s data symbol rate that the data symbols were input.

The interleaved data symbols are input to a modulator (104). The modulator (104) derives a sequence of fixed length Walsh codes from the interleaved data symbols. In 64-ary orthogonal code signaling, the interleaved data symbols are grouped into sets of six to select one out of the 64 orthogonal codes to represent the set of six data symbols. These 64 orthogonal codes correspond to Walsh codes from a 64 by 64 Hadamard matrix wherein a Walsh code is a single row or column of the matrix. The modulator outputs a sequence of Walsh codes, corresponding to the input data symbols at a fixed symbol rate, to one input of an XOR combiner (107).

A pseudo random noise (PN) generator (103) uses a long PN sequence to generate a user specific sequence of symbols. In a mobile radiotelephone having an electronic serial number (ESN), the ESN can be exclusive-ORed with the long PN sequence to generate the sequence, making the sequence specific to that radiotelephone user. The long PN generator (103) inputs and outputs data at the spreading rate of the system. The output of the PN generator (103) is coupled to the XOR combiner (107).

The Walsh code spread symbols from the combiner (107) are next spread in quadrature. The symbols are input to two XOR combiners (108 and 109) that generate a pair of short PN sequences. The first combiner (108) XORs the Walsh code spread symbols with the in-phase (I) sequence (105) while the second combiner (109) XORs the Walsh code spread symbols with the quadrature phase (Q) sequence (106).

The resulting I and Q channel code spread sequences are used to bi-phase modulate a quadrature pair of sinusoids by driving the power level of the pair of sinusoids. The sinusoidal output signals are then summed, bandpass filtered, translated to an RF frequency, amplified, filtered, and radiated by an antenna.

The typical prior art CDMA transmitter used on the forward channel of a radiotelephone system, the link from the base station to the mobile, is similar to the reverse channel. This transmitter is illustrated in FIG. 4. The difference between the forward and reverse channel transmitters is the addition of a Walsh code generator (401) and power control bit multiplexer (420) between the PN generator combiner (103) and the quadrature spreading combiners (108 and 109) for the forward channel transmitter.

The power control bit multiplexer (420) multiplexes a power control bit in place of another bit in the frame. The mobile knows the location of this bit and looks for this power control bit at that location. As an example, a "0" bit instructs the mobile to increase its mean output power level a predetermined amount and a "1" bit instructs the mobile to decrease its mean output level a predetermined amount.

The code division channel selection generator (401) is coupled to a combiner (402) and provides a particular Walsh code to the combiner (402). The generator (401) provides one of 64 orthogonal codes corresponding to 64 Walsh codes from a 64 by 64 Hadamard matrix wherein a Walsh code is a single row or column of the matrix. The combiner (402) uses the particular Walsh code input by the code division channel generator (401) to spread the input scrambled data symbols into Walsh code spread data symbols. The Walsh code spread data symbols are output from the XOR combiner (402) and into the quadrature spreading combiners at a fixed chip rate of 1.2288 Mchp/s.

The mobile can aid the base station in the control of the power on the forward channel by transmitting a power control message to the base station on the reverse link. The mobile gathers statistics on its error performance and informs the base station via the power control message. The base station may then adjust its power to the specific user accordingly.

The problem with the type of power control described above is that, for the forward link control, the power control message replaces voice or data bits, thereby reducing the quality of the voice or the data throughput. This fundamentally limits the rate at which mobile stations can send power control messages to the base station and in turn the rate at which the base station can adjust the output power to this specific mobile. A high update rate transmit power adjustment would allow the base station to tune the transmit power to each individual mobile station to a minimum level necessary to maintain a link of a specified quality. By minimizing each individual transmit power, the total interference generated is also minimized, thus improving the capacity of the system. There is a resulting need for updating the power output of a transmitter at a higher rate without substantially degrading the quality of the data in the transmission.

SUMMARY OF THE INVENTION

The process of the present invention enables a transmitter to update the power output to each mobile station to which it is communicating on a frame by frame basis. The process is accomplished through a feedback mechanism from the mobile station to the base station. Through the feedback mechanism, the mobile station informs the base station on whether it is receiving frames correctly or incorrectly by including such information on every frame of data transmitted to the base station.

The process first determines whether the power output of the transmitter, with which communication is established, is to be increased or decreased. The process then informs that transmitter to change its power accordingly by including power control bits in each frame of data transmitted.

Another embodiment of the process of the present invention enables a communication link to have a higher data rate input signal while maintaining a constant data rate output signal. The method first convolutionally encodes the input data signal to produce a plurality of convolutionally encoded signals. Each of the convolutionally encoded signals are comprised of a plurality of data symbols. Each data symbol is repeated a predetermined number of times to produce a code repetition data sequence at a predetermined and fixed rate. The data sequence is then punctured such that symbols in predetermined locations of the data sequence are deleted thus generating a data sequence at a predetermined and fixed rate which is lower than that of the original data sequence.

The encoded signals with the repeated data symbols are multiplexed to produce a data sequence.

DETAILED DESCRIPTION OF THE PREFERRED EMBODIMENT

The variable data rate communication link process of the present invention enables the data rate of a signal input to a convolutional encoder to be variable without changing the data rate of the encoded signal. This enables a higher quality voice channel or a faster facsimile or data channel to be used without increasing the fixed output rate of 19.2 kbps. The variable data rate is obtained by puncturing a rate ½ convolutional code to obtain a rate ¾ convolutional code. For example, a fixed input data rate of 9600 bps encoded by a rate ½ convolutional code produces a fixed output data rate of 9600·2=19.2 kbps. Equivalently, a fixed input data rate of 14400 bps encoded by a rate ¾ convolutional code produces a fixed output data rate of 14400·4/3 =19.2 kbps.

Figure 1:
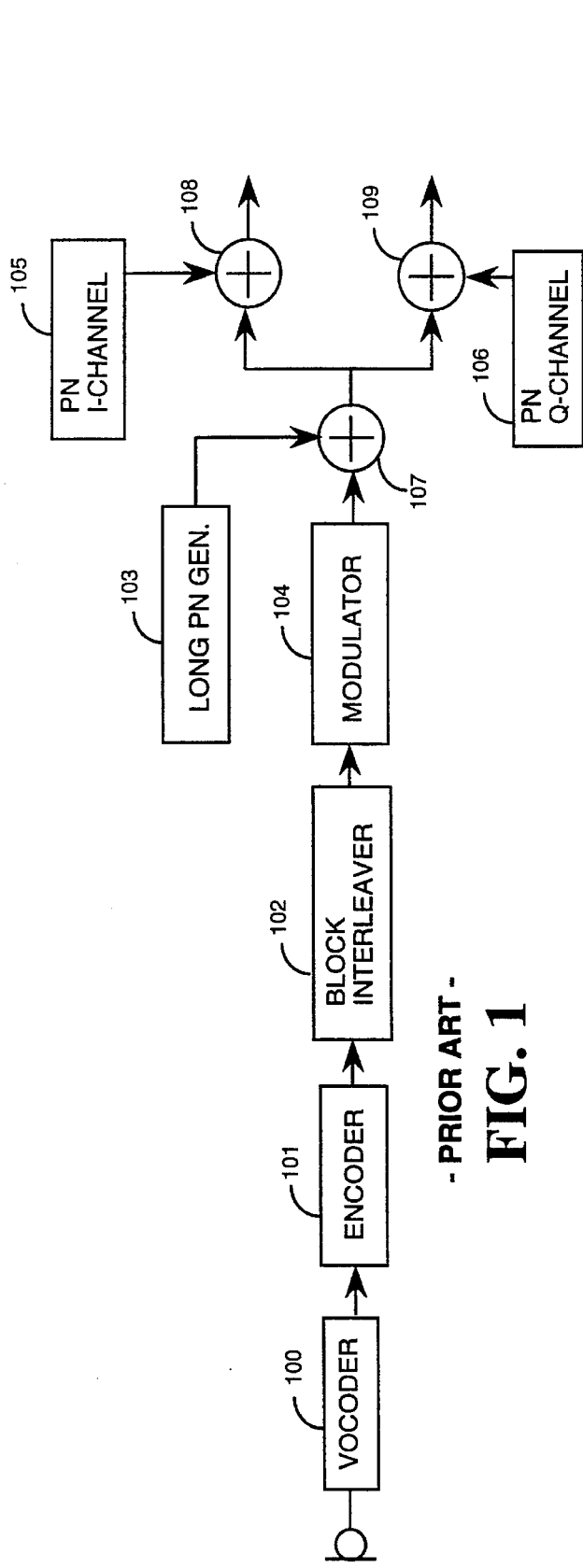
FIG. 1 shows a typical prior art CDMA, reverse link transmitter for use in a radiotelephone system.
Figure 4:
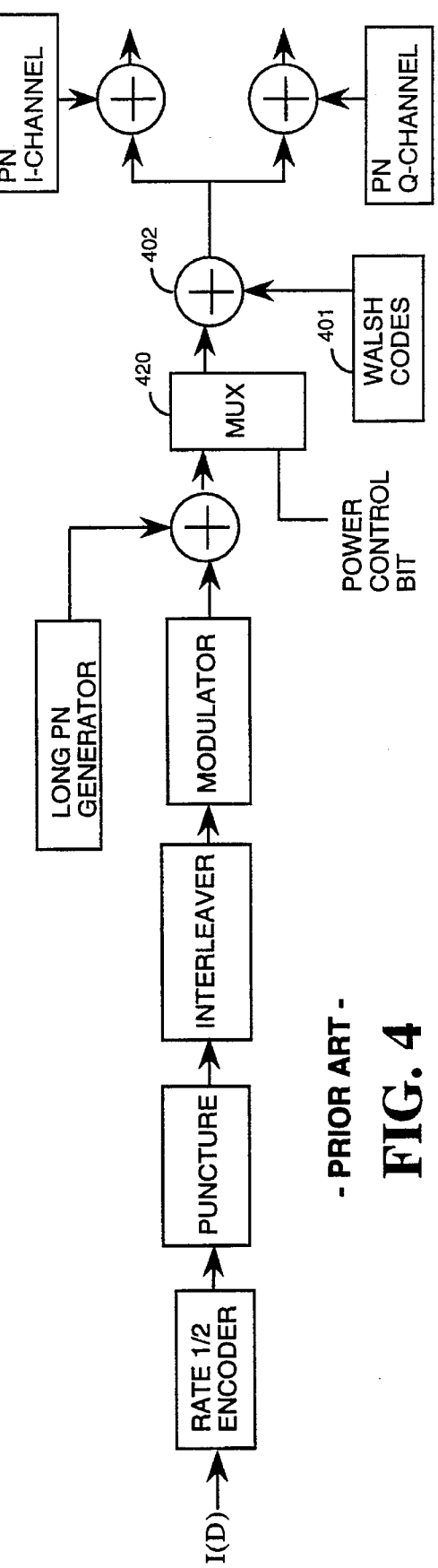
FIG. 4 shows a typical prior art CDMA, forward link transmitter for use in a radiotelephone system.
Figure 2:
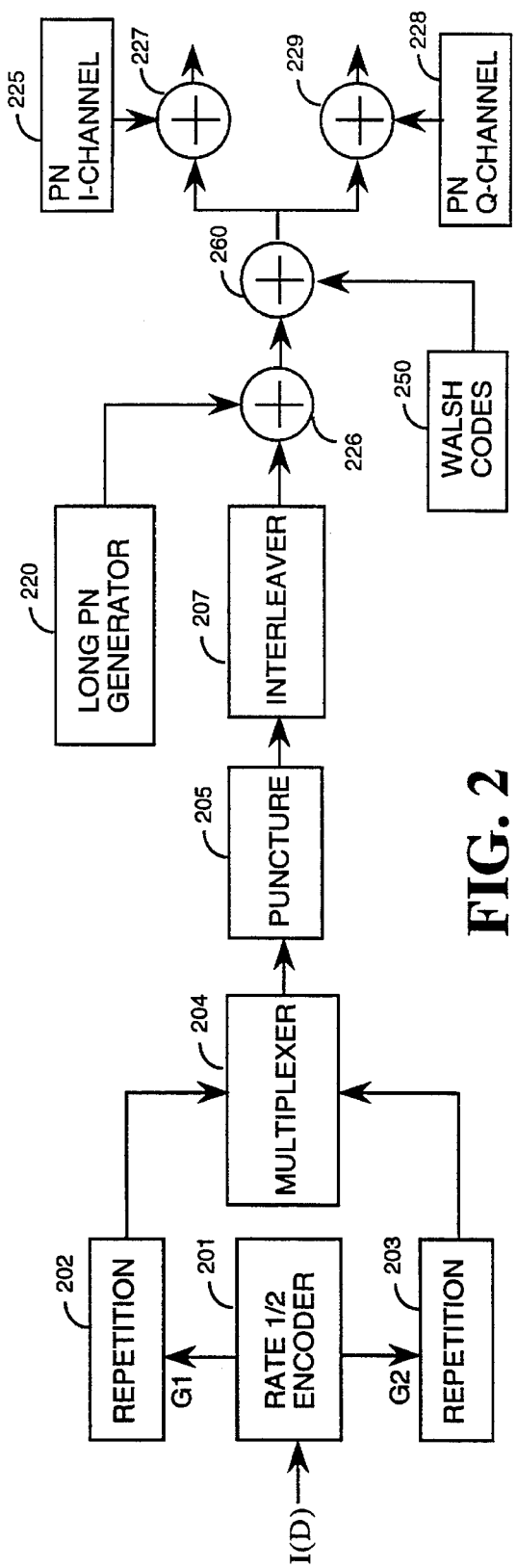
FIG. 2 shows the forward communication link process of the present invention as used in a CDMA radiotelephone system.

The forward communication link process of the present invention is illustrated in FIG. 2. The process begins with a data signal, I(D), being input to the convolutional encoder (201). The process enables the data rate of this signal to be variable and as high as 14.4 kbps. The convolutional encoder (201), in the preferred embodiment, is a rate ½ encoder.

The convolutional code has the generating polynomials $G_1$=753 and $G_2$=561. In polynomial notation, the generating polynomials appear as:

$$G_1(D)=1+D+D^2+D^3+D^5+D^7+D^8$$

$$G_2(D)=1+D^2+D^3+D^4+D^8$$

Since this is a rate ½ encoder (201), for every one bit input to the encoder (201), two symbols will be output. By way of example, if the input signal is comprised of bits $b_0$, $b_1$, and $b_2$, the output symbol sequences are: $C_{11}$, $C_{12}$, $C_{13}$, $C_{14}$, $C_{15}$, $C_{16}$ . . . for $G_1$ and $C_{21}$, $C_{22}$, $C_{23}$, $C_{24}$, $C_{25}$, $C_{26}$ . . . for $G_2$. Therefore, without the process of the present invention, the input must be 9.6 kbps in order to maintain the standard 19.2 kbps output of the rate ½ encoder.

The next step of the process inserts a repeat (202 and 203) of each of the output symbols into the symbol sequence. The data rate is set by the speech encoder or by the data service controller so it knows how many symbol repeats need to be inserted to obtain the proper data rate. In the preferred embodiment, the symbols are repeated once so that the output symbol sequences are:

$C_{11}$, $C_{11}$, $C_{12}$, $C_{12}$, $C_{13}$, $C_{13}$, $C_{14}$, $C_{14}$, $C_{15}$, $C_{15}$, $C_{16}$, $C_{16}$ . . . for $G_1$ and $C_{21}$, $C_{21}$, $C_{22}$, $C_{22}$, $C_{23}$, $C_{23}$, $C_{24}$, $C_{24}$, $C_{25}$, $C_{25}$, $C_{26}$, $C_{26}$ . . . for $G_2$.

A parallel to serial conversion is performed on these symbol sequences by a multiplexer (204). The two symbol sequences are input to the multiplexer (204) at a 14.4 kbps rate and are output from the multiplexer as a single sequence having a data rate of 28.8 kbps. This multiplexing step generates the symbol sequence:

$C_{11}, C_{21}, C_{11}, C_{21}, C_{12}, C_{22}, C_{12}, C_{22}, C_{13}, C_{23}, C_{13}, C_{23}, C_{14}, C_{24}, C_{14}, C_{24}, C_{15}, C_{25}, C_{15}, C_{25}, C_{16}, C_{26}, C_{16}, C_{26} \ldots$ This sequence is then punctured (205) using 110101 as the puncturing pattern, each 0 being the punctured bit. This pattern is implemented by deleting from the symbol sequence all bits that are in locations 6n+3 and 6n+5, where n is an integer in the range of 0 to ∞. Alternate embodiments can puncture the symbol sequence in different locations and at a different rate. The result of this operation is the following symbol sequence:

$C_{11}, C_{21}, C_{21}, C_{22}, C_{12}, C_{22}, C_{23}, C_{23}, C_{14}, C_{24}, C_{24}, C_{25}, C_{15}, C_{25}, C_{26}, C_{26} \ldots$ The symbols are then input into a block interleaver (207). It will be appreciated by those skilled in the art that other types of interleaving can be used in alternate embodiment without departing from the scope of the present invention. The interleaved data symbols are output by the interleaver (207) at the same data symbol rate that they were input, 19.2 kbps. The interleaved symbol sequence is input to one input of the XOR combiner (226).

The interleaving is necessary to reduce the likelihood that a fade or interference will cause a large gap in the data sequence. In the case in which symbols are also repeated, losing a symbol will not necessarily cause a total loss of data, thus providing improved performance.

A long pseudo-noise (PN) generator (220) is coupled to the other input of the XOR combiner (226) to provide a spreading sequence to the XOR combiner (226). The long PN generator (220) uses a long PN sequence to generate a user specific sequence of symbols or unique user code at a fixed rate, 19.2 kbps in the preferred embodiment. In addition to providing an identification as to which user sent the traffic channel data bits over the communication channel, the unique user code enhances the privacy of the communication in the communication channel by scrambling the traffic channel data bite. The XOR combiner (226) uses the unique user code input by long PN generator (220) to spread the input Walsh coded data symbols into user code spread data symbols. This spreading by the XOR combiner (226) provides a factor increase in the overall spreading of the traffic channel data bits to data symbols. The user code spread symbols are output from the XOR combiner (226) at a fixed chip rate, 1.228 Mchp/s in the preferred embodiment.

The code spread symbols are input to a combiner (260) that is also coupled to a code division channel selection generator (250) that provides a particular length Walsh code to the combiner (260). The generator (250) provides one of 64 orthogonal codes corresponding to 64 Walsh codes from a 64 by 64 Hadamard matrix wherein a Walsh code is a single row or column of the matrix. The combiner (260) uses the particular Walsh code input by the code division channel generator (250) to spread the input scrambled data symbols into Walsh code cover data symbols. The Walsh code cover data symbols are output from the XOR combiner (260) and into the quadrature covering combiners (227 and 229) at a fixed chip rate of 1.2288 Mchp/s.

A pair of short PN sequences (i.e. short when compared to the long PN sequence used by the long PN generator (220)) are generated by an I-channel PN generator (225) and a Q-channel PN generator (228). These PN generators (225 and 228) may generate the same or different short PN sequences. The XOR combiners (227 and 229) further spread the input Walsh code spread data with the short PN sequences generated by the PN I-channel generator (225) and PN Q-channel generator (228), respectively. The resulting I-channel code spread sequence and Q-channel code spread sequence are used to bi-phase modulate a quadrature pair of sinusoids by driving the power level controls of the pair of sinusoids. The sinusoids are summed, bandpass filtered, translated to an RF frequency, amplified, filtered and radiated by an antenna to complete transmission of the symbol sequence on the forward communication link.

Figure 3:
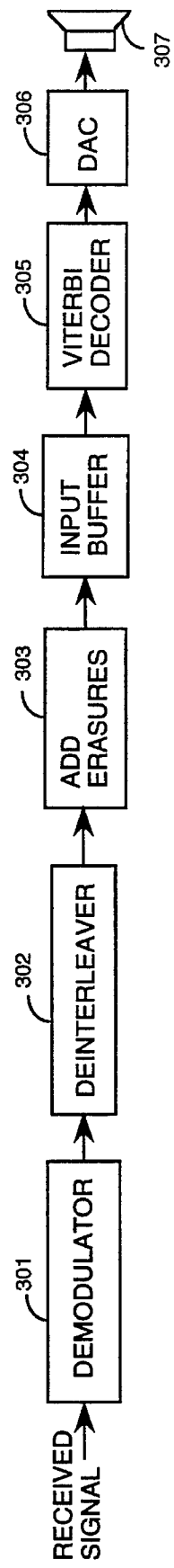
FIG. 3 shows the mobile radio process of the present invention as used in a CDMA radiotelephone system.

In a CDMA cellular radiotelephone system, a process is required in the mobile radio unit to interpret the symbol sequence transmitted on the forward communications link. This mobile unit process of the present invention is illustrated in FIG. 3.

The mobile unit process first demodulates the received symbol sequence (301). The demodulated signal is then input to a deinterleave process (302) to reverse the interleaving of the forward link process. The result of this operation is the original sequence of symbols, including the repeated symbols, as it was input to the interleaver of the forward link process.

The output symbol sequence is then processed to fill in the symbols that were deleted in the forward link puncture process (303). Since the receiving mobile has the same puncturing pattern as the base, it knows which symbols were deleted and can therefore replace these deleted symbols with empty spaces, also known as erasures. The output of this operation is as follows, where E is the erasure:

$C_{11}, C_{21}, E, C_{21}, E, C_{22}, C_{12}, C_{22}, E, C_{23}, E, C_{23}, C_{14}, C_{24}, E, C_{24}, E, C_{25}, C_{15}, C_{25}, E, C_{26}, E, C_{26} \ldots$ This sequence is then input to a buffer (304) for temporary storage. The buffer allows the Viterbi decoder to process the sequence of symbols multiple times to determine the data rate.

The Viterbi decoder (305) also assigns a null metric to the erasure bits as is well known in the art. The output of the Viterbi decoder is digital data that is converted to an analog signal by a digital to analog converter (306). The analog signal can then be used to drive a speaker (307) in the mobile unit.

The symbols transmitted on the forward and reverse channels are formatted into frames, each frame having a 20 millisecond length. Copending patent application U.S. Ser. No. 07/822,164 to Padovani et al. and assigned to the assignee of the present invention recites a more detailed explanation of these frames. The amount of data transmitted in each frame depends on the data rate. The frame composition for each data rate for the forward and reverse channels is illustrated in the following table:

| Raw # bits | CRC | Tail | Rsrvd | Info bit | Rate |
|---|---|---|---|---|---|
| 288 | 12 | 8 | 3 | 265 | 13250 |
| 144 | 10 | 8 | 2 | 124 | 6200 |
| 72 | 8 | 8 | 2 | 54 | 2700 |
| 36 | 6 | 8 | 2 | 20 | 1000 |

The rate listed in the table is the information bit rate. The reserved bits for the forward and reverse channels, in the preferred embodiment, are for signaling, power control, and future use.

Figure 5:
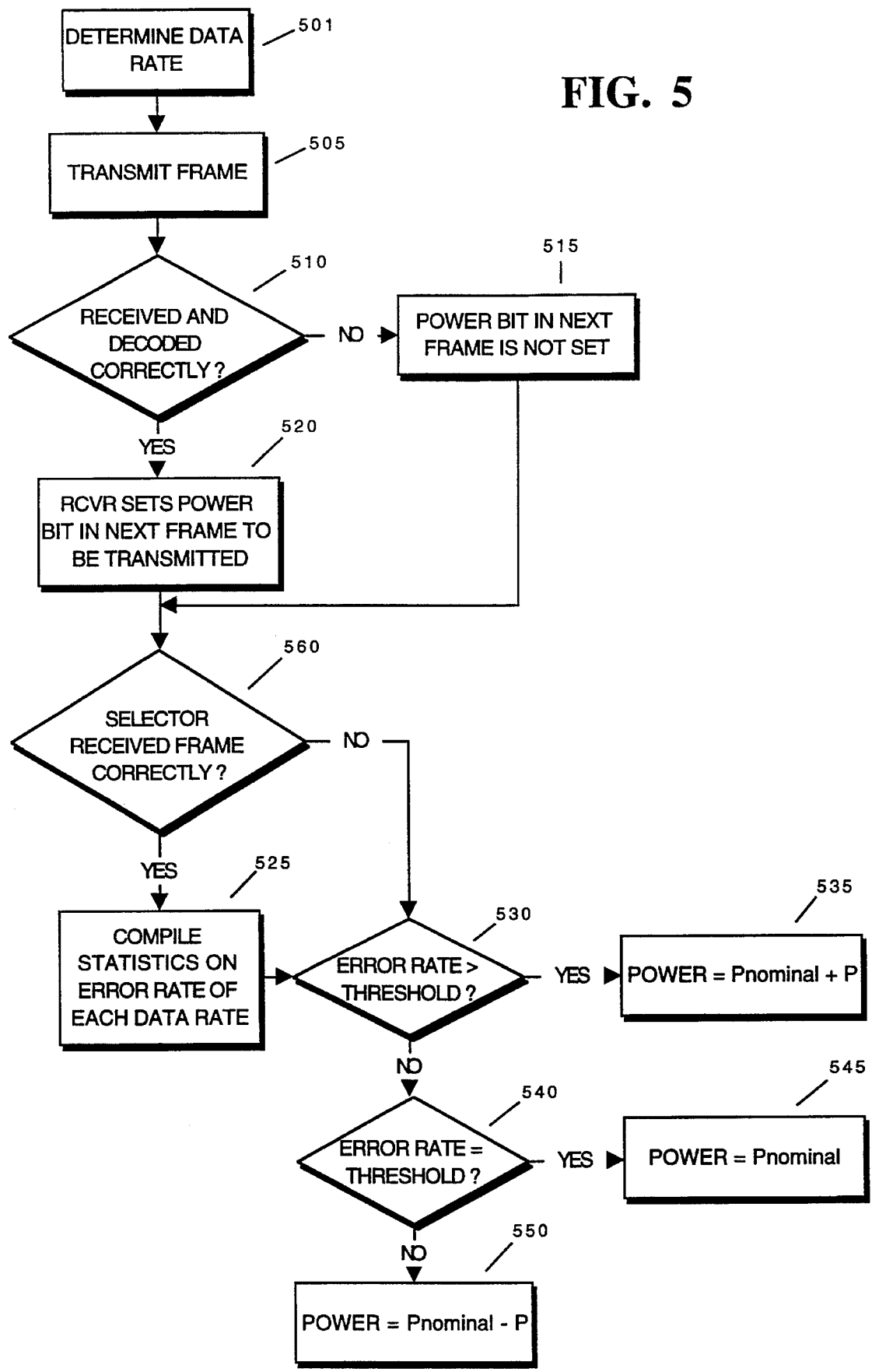
FIG. 5 shows the forward link power control process of the present invention.

The transmit power of the forward channel transmitters can be controlled on the reverse channel by the power control process of the present invention, illustrated in FIG. 5. The power control process will be described as being used in the CDMA cellular radiotelephone system, but the process can be used in other communication systems.

The selector of the land network determines the rate at which a frame is sent to a mobile (501) and sends the frame to all base stations communicating with that particular mobile. The selector is part of the base station and is responsible for the call processing requirements of the base station.

During soft hand-off, more than one base station is communicating with a mobile. The base stations transmit the frame to the mobile (505). After combining the data from possible multiple base stations, the mobile determines whether the last frame (510) has been received and decoded correctly. If the mobile correctly decoded the last frame, the mobile sets the power control bit in the next frame (520) that is transmitted to the base stations.

Since the selector knows the rate at which it transmitted the last frame to the mobile and it now has feedback from the mobile on whether that frame was correctly decoded, the selector compiles a table of statistics (525) on the error rates that the mobile station is incurring at each rate. The "received correctly" entries in the table are incremented only if the reverse link frame from the mobile, containing the feedback bit, was received and decoded correctly (515).

|  | TX at full rate | TX at ½ rate | TX at ¼ rate | TX at ⅛ rate |
| --- | --- | --- | --- | --- |
| RX correctly | I1 | J1 | K1 | L1 |
| Erased | I2 | J2 | K2 | L2 |
| Total | I = I1 + I2 | J = J1 + J2 | K = K1 + K2 | L = L1 + L2 |
| Error rate | $I2/I$ | $J2/J$ | $K2/K$ | $L2/L$ |

The selector also maintains a table of predetermined target error rates T1, T2, T3, and T4, one for each rate. If the present invention is used in a cellular radiotelephone system, these error rates can be set by the cellular service carrier in order to provide a specific grade of service.

The selector next calculates the following differences.

$$E1 = I2/I - T1$$

$$E2 = J2/J - T2$$

$$E3 = K2/K - T3$$

$$E4 = L2/L - T4$$

The selector determines the power level at which the next frame is to be transmitted by comparing to zero the respective difference just calculated. For example, if the frame is to be transmitted at a full rate and E1>0 (530), the power level will be $P_{nominal} + P$ (535), where P is a function of the value of E1 and $P_{nominal}$ is the power level set by the carrier for that geographical area. If E1=0 (540), the power level will be $P_{nominal}$ (545). If E1<0, the power level is $P_{nominal} - P$ (550). The other data rates follow the same procedure. The selector forwards the next frame to be transmitted to the mobile to the base stations that are communicating with the mobile. An indication of the power level at which the frame is to be transmitted is included with this frame.

Alternate embodiments of the present invention insert more than one repeat of each symbol into the symbol sequence, depending on the data rate input to the encoder. For example, if a 2.4 kbps data rate is input to the encoder, the symbols should be repeated three more times, for a total of 4 of the same symbols, in the output sequence to maintain a 19.2 kbps output data rate. By adding more or less repeats, the input data rate can be varied while maintaining the output at 19.2 kbps as required by the CDMA interim specification from the Electronic Industries Association/Telephone Industries Association, IS-95.

Alternate embodiments may puncture first and repeat afar the puncturing process. However, the preferred embodiment doesn't destroy the symbol as would be done if the symbols were punctured before the repeat process. By repeating first, the repetition of the symbol still exists after the puncture and, therefore, this information can still be transmitted.

Alternate embodiments may also require an output rate different from the 19.2 kbps required by the CDMA specification for the base station to mobile station link. An example of such an embodiment is the mobile station to base station link in which the specification calls for a 28800 bps rate. In this case, a 14400 bps information rate coupled with a rate ½ convolutional code achieves the desired rate of 14400·2=28800 bps.

By puncturing a rate ½ code to obtain a rate ¾ code, the process of the present invention enables a higher data rate to be supported by an encoder while the output remains constant. The puncturing process and the code symbol repetition process also enables also enables the encoder to support variable data rates, such as 14.4, 7.2, 3.6, and 1.8 kbps, while keeping the output of the encoder stable at 19.2 kbps by increasing the number of repetitions of the symbols. By using the puncturing process in a radiotelephone having the capability of operating in the CDMA radiotelephone system, higher voice quality and faster data and facsimile transmissions are achieved.

The fast forward power control process of the present invention enables a mobile to instruct a base station to change its power output at a faster rate. This process enables the mobile to send a power change command every frame of data without degrading the voice or data quality.

The performance degradation associated with the puncturing process of a rate ½ code in the base station to mobile station link is more than compensated for by the fast forward power control process of the present invention. The fast forward power control process of the present invention enables a mobile to instruct the base stations to adjust their power output at a 50 Hz rate (every frame) in comparison to rates of 0.2 Hz that can be achieved through other signaling methods that replace complete flames with power control information. This process enables the mobile to send a power change request every frame of data by using a single information bit per frame and, therefore, without degrading the voice quality or considerably reducing the data throughput.

We claim:

1. A method for controlling power of a first communication device by a second communication device, the first communication device transmitting over a forward communications channel at at least one data rate, the second communication device transmitting over a reverse communications channel, the method comprising the steps of:

the first communication device transmitting a plurality of frames on the forward communications channel, each frame being transmitted at a predetermined data rate of the at least one data rate;

the second communication device decoding the plurality of frames;

the second communication device transmitting a decode indication to the first communication device in response to whether each flame was successfully decoded;

determining a frame error rate for each predetermined data rate in response to the decode indication;

generating a difference, for each predetermined data rate, between the frame error rate and a predetermined target error rate;

if the difference is greater than a predetermined threshold, adjusting the power of the first communication device to a first predetermined level;

if the difference is equal to the predetermined threshold, adjusting the power of the first communication device to a second predetermined level; and if the difference is less than the predetermined threshold, adjusting the power of the first communication device to a third predetermined level.

2. The method of claim 1 wherein the predetermined threshold is 0.

3. The method of claim 1 wherein the predetermined target error rate is different for each data rate.

4. A method for controlling power of a base station transmitter by a mobile radio, the base station transmitter transmitting over a forward communications channel at a plurality of data rates, the mobile radio transmitting over a reverse communications channel, the method comprising the steps of, the base station transmitting a plurality of data flames on the forward communications channel, each data flame being transmitted at a predetermined data rate of the plurality of data rates;

the mobile radio decoding the plurality of data frames;

the mobile radio transmitting a decode indication to the base station in response to whether each data frame was successfully decoded;

determining a frame error rate for each predetermined data rate in response to the decode indication;

generating a difference, for each predetermined data rate, between the frame error rate and a predetermined target error rate;

if the difference is greater than a predetermined threshold, adjusting the power of the first communication device to a first predetermined level;

if the difference is equal to the predetermined threshold, adjusting the power of the first communication device to a second predetermined level; and if the difference is less than the predetermined threshold, adjusting the power of the first communication device to a third predetermined level.

* * * * *